United States Patent
Cohen et al.

(10) Patent No.: US 7,161,220 B2
(45) Date of Patent: Jan. 9, 2007

(54) HIGH SPEED PHOTODIODE WITH A BARRIER LAYER FOR BLOCKING OR ELIMINATING SLOW PHOTONIC CARRIERS AND METHOD FOR FORMING SAME

(75) Inventors: Guy Moshe Cohen, Mohegan Lake, NY (US); Qiqing C. Ouyang, Elmsford, NY (US); Jeremy Daniel Schaub, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/329,185

(22) Filed: Jan. 11, 2006

(65) Prior Publication Data

US 2006/0118894 A1    Jun. 8, 2006

Related U.S. Application Data

(63) Continuation of application No. 10/321,660, filed on Dec. 18, 2002, now Pat. No. 7,022,544.

(51) Int. Cl.
 *H01L 27/14* (2006.01)

(52) U.S. Cl. .............................. 257/431; 257/E31.054; 257/E21.04; 257/E21.057

(58) Field of Classification Search ................ 257/414, 257/E31.054, E21.04, E21.057
See application file for complete search history.

(56) References Cited

U.S. PATENT DOCUMENTS

| | | | |
|---|---|---|---|
| 3,990,059 A | 11/1976 | Carlo et al. .................. | 340/174 |
| 4,875,084 A | 10/1989 | Tohyama ...................... | 357/14 |
| 5,285,078 A | 2/1994 | Mimura et al. | |
| 5,318,676 A | 6/1994 | Sailor et al. | |
| 5,525,828 A | 6/1996 | Bassous et al. .............. | 257/657 |
| 5,696,629 A | 12/1997 | Berger et al. | |
| 5,942,771 A | 8/1999 | Ishimura ...................... | 257/184 |
| 6,177,289 B1 | 1/2001 | Crow et al. ................... | 438/16 |
| 6,265,823 B1 | 7/2001 | Dobson et al. | |
| 6,451,702 B1 | 9/2002 | Yang et al. .................. | 438/706 |
| 6,683,367 B1 | 1/2004 | Stalmans et al. | |
| 2003/0094664 A1 | 5/2003 | Yagi ........................... | 257/431 |
| 2004/0038503 A1* | 2/2004 | Fu et al. ...................... | 438/511 |

FOREIGN PATENT DOCUMENTS

| | | |
|---|---|---|
| JP | 5-145051 | 6/1993 |
| JP | 10-65206 A | 3/1998 |
| JP | 10-290022 | 10/1998 |
| JP | 2001-135808 | 5/2001 |
| JP | 2002-203983 A | 7/2002 |
| JP | 2004-103668 | 4/2004 |

OTHER PUBLICATIONS

Philippe Lalanne, et al., "CMOS Photodiodes Based on Vertical p-n-p Junctions", Institut d'Optique Theorique et Appliquee, 1977, pp. 1-8.

(Continued)

*Primary Examiner*—Caridad Everhart
(74) *Attorney, Agent, or Firm*—Anne V. Dougherty, Esq.; McGinn IP Law Group, PLLC

(57) ABSTRACT

A structure (and method for forming the structure) includes a photodetector, a substrate formed under the photodetector, and a barrier layer formed over the substrate. The buried barrier layer preferably includes a single or dual p-n junction, or a bubble layer for blocking or eliminating the slow photon-generated carriers in the region where the drift field is low.

19 Claims, 12 Drawing Sheets

OTHER PUBLICATIONS

Min Yang et al., "A CMOS-Compatible High-Speed Silicon Lateral Trench Photodetector", Proceedings of the 59th DRC (2001), pp. 153-154.

Jacob Y.L. Ho et al., "High-speed and high-sensitivity silicon-on-insulator metal-semiconductor-metal photodetector with trench structure", Dept. of Physics, The Hong Kong University of Science and Technology, Clear Water Bay, Kowloon, Hong Kong, May 6, 1996, Appl. Phys. Lett. 69 (1), pp. 16-18.

Min Yang et al., "High Speed Silicon Lateral Trench Detector on SOI Substrate", IEDM, paper 24-1 (2001), pp. 1-4.

S.J. Koester et al., "1.1 GHz MSM Photodiodes on Relaxed Si1–xGex Grown by UHV-CVD", IEDM, paper 24-1 (2001), 1998 DRC pp. 60-61 (2001).

T.K. Woodward et al., "1-Gb/s Integrated Optical Detectors and Receivers in Commercial CMOS Technologies", IEEE Journal of Selected Topics in Quantum Electronics, vol. 5, No. 2, Mar./Apr., 1999, pp. 146-156.

Phillippe Lalanne et al., "CMOS photodiodes based on vertical p-n-p junctions", Workshop on Optics and Computer Science, Proc. 11th Int. Parallel Processing, Symp., Geneva, Switzerland Apr. 15, 1997, pp. 1-8.

Kwark, et al., "Silicon-On-Insulator (SOI) Trench Photodiode and Method of Forming Same", U.S. Patent Appl. No. 09/678,315.

* cited by examiner

HIGH SPEED PHOTODIODE WITH A BARRIER LAYER FOR BLOCKING OR ELIMINATING SLOW PHOTONIC CARRIERS AND METHOD FOR FORMING SAME

The present Application is a Continuation Application of U.S. patent application Ser. No. 10/321,660 filed on Dec. 18, 2002 now U.S. Pat. No. 7,022,544.

U.S. GOVERNMENT RIGHTS IN THE PATENT

The present invention was at least partially funded under National Institute of Standards and Technology (NIST) Contract No. 70NANB8H4018, and the U.S. Government has at least some rights under any subsequently-issued patent.

CROSS-REFERENCE TO RELATED APPLICATIONS

The present application is related to commonly-assigned U.S. patent application Ser. No. 09/678,315, filed on Oct. 3, 2000, to Y. H. Kwark et al., entitled "Silicon-on-insulator trench photodiode structure for improved speed and differential isolation", incorporated herein in its entirety.

BACKGROUND OF THE INVENTION

1. Field of the Invention

The present invention relates to a semiconductor device, and more particularly to a photodiode, and to a method of forming a buried layer for blocking or eliminating slow photo-generated carriers in a region where the electric field is low.

2. Description of the Related Art

The absorption length of 850 nm light in silicon is 15–20 µm, which is much longer than the 1–2 µm absorption lengths of typical III–V semiconductors such as GaAs at this wavelength.

As a result, high speed silicon photodetectors are often designed with a lateral structure, rather than a vertical structure, in an attempt to decouple the photocarrier transit time from the absorption length and to minimize the complexity of fabricating large scale vertical features, since semiconductor processing is typically optimized for thin film (<<1 micron) features.

These lateral structures typically take the form of either: (1) a PIN detector with diffused or implanted fingers; or (2) a metal-semiconductor-metal (MSM) detector. In these lateral structures, the electric field is relatively high at the surface of the semiconductor and decreases at lower depths. Photocarriers that are generated relatively deep below the surface of the semiconductor experience a weak electric field and slowly drift up to the contacts. These "slow carriers" create a low frequency tail in the frequency response that limits the overall bandwidth of the device to be less than about 1 GHz in silicon.

Thus, in a photodetector employing silicon, the absorption length is somewhat large (e.g., it could extend to 20 µm below the surface (or even more depending upon the wavelength)) and, as a result, if absorption is too deep, the "slow carriers" will still reach the contact areas (e.g., the anode and cathode) of the detector. A problem arises in that an electric field which is induced deep in the semiconductor is not as strong as that near the surface at the anode and cathode.

Thus, again, the carriers will slowly drift upward to the anode and cathode. Hence, when a very short pulse of light is exciting the detector, in an ideal photodetector, the same (e.g., shape, etc.) would be reflected in the current that the photodetector produces since the very short pulse of light would result in a very short pulse of electrons in the detector.

However, if the carriers are collected over a long period of time, then instead of a short current pulse, one would obtain a fast rise in the current followed by a slow decay (e.g., a long "tail"), since it takes some time to collect the deep (slow) carriers. This is a problem in that the "long tail" is unacceptable for transfer of information and the like, especially over an optical fiber. Specifically, since each pulse is used for transmitting one bit, then the bits must be spaced fairly far away from each other on a timing scale. Otherwise, it would be difficult to distinguish one bit from another if the long tail was present. This limits the bit rate that can be used with this photodetector.

The above effect can be somewhat minimized by using a lateral trench detector (LTD) structure, as described in U.S. Pat. No. 6,177,289 to J. Crow, et al., entitled "Lateral trench optical detector", and U.S. Pat. No. 6,451,702, to M. Yang, et al., entitled "Methods for forming lateral trench optical detectors". However, the carriers generated below the deep trenches limit the bandwidth, as described in M. Yang, et al., Proceedings of the 59th DRC, p. 153, (2001).

Even GaAs MSM detectors, where most of the absorption occurs near the surface, have bandwidths limited to about 2–3 GHz due to the fringing electric field. As a result, the majority of photodetectors currently used in industry utilize vertical PIN structures to achieve 10 GHz bandwidth operation.

The objective is to block the slow carriers without degrading other properties of the detector. One solution is to block the carriers with a silicon-on-insulator (SOI) structure, as described in commonly assigned, copending U.S. patent application Ser. No. 09/678,315, to Y. H. Kwark et. al, entitled "Silicon-on-insulator trench photodiode structure for improved speed and differential isolation", J. Y. L. Ho, et. al., Appl. Phys. Lett. 69, 16 Yang, et. al., 2001 paper 24-1 (2001). Bandwidths of about 2.0 GHz at 3.3 V with a peak quantum efficiency of 51% have been reported using SOI, as described in Min Yang, et. al., 2001 paper 24-1 (2001).

However, if the SOI layer is present, then a very different material is provided beneath the silicon layer which performs the absorption. That is, some of the light which has not been absorbed will reach the barrier layer, and then will be reflected back into the detector. This is not necessarily disadvantageous, but if the surface is very flat (e.g., the buried oxide is extremely flat), then the surface acts as a specular reflector, and, as a result, the structure's reflectivity will be highly dependent upon the wavelength. Hence, this structure acts as a resonant cavity formed by the three layers (e.g., an upper layer, the silicon layer, and the buried oxide layer).

Thus, the reflection at the bottom silicon/oxide interface creates a resonant cavity structure in which the quantum efficiency is a strong function of the wavelength of the incident light. This effect is also referred to as the "etalon effect." While the SOI film is at least 8 µm thick to allow sufficient light absorption, its thickness must be controlled with an accuracy of better than 0.75% to achieve a minimum reflection. Such tight control is difficult to obtain over a single wafer and from wafer-to-wafer.

Specifically, the characteristics of the resonator include that there are minimas in the transmission. Each of the minima represents that almost no light is being absorbed in the detector. The minima should be avoided if possible, but this is difficult to achieve if the photodetector structure layer is thick, since then the minima are very closely spaced. On the other hand, while it may be possible to make the layer thinner, then there would not be a large absorption volume and the quantum efficiency would suffer (e.g., the amount of photons which are converted into electrons is very poor).

Moreover, the use of SOI has other disadvantages. For example, the cost of a SOI wafer is currently about five times that of bulk silicon.

Further, SOI wafer fabrication techniques such as SIMOX or bonding are suited for making thin SOI wafers, having a SOI thickness of less than about 1 µm thick. As a result, the fabrication of thick SOI wafers requires an additional step of silicon epitaxy for thickening the SOI film to about 8 µm.

In another conventional technique, as described in U.S. Pat. No. 5,525,828, to Bassous et al., entitled "High speed silicon-based lateral junction photodetectors having recessed electrodes and thick oxide to reduce fringing fields", such a problem of light generating carriers existing deep within the semiconductor beyond the influence of the electric field, have been addressed.

Specifically, U.S. Pat. No. 5,525,828 has attempted to form a barrier layer at a predetermined distance below an interface for limiting collection of light generated carriers by an electrode.

However, as a barrier for the slow carriers, U.S. Pat. No. 5,525,828 proposes a heavily doped layer. The heavily doped layer has a short lifetime for minority carriers, thus increasing the chance of recombination for slow carriers that were formed below the heavily doped layer.

Further, such a heavily doped layer is difficult to manufacture due to dopant diffusion problems. Indeed, while it is disclosed that the heavily doped layer reduces the carriers lifetime, there is nothing disclosed about the formation of a potential barrier to block the carriers. A lightly doped P-N junction would circumvent problems such as dopant diffusion and mutual-capacitance that are typical with heavily doped layers.

SUMMARY OF THE INVENTION

In view of the foregoing and other problems, drawbacks, and disadvantages of the conventional techniques, a purpose of the present invention is to provide a high speed photodiode that essentially has very few (or preferably no) slow carriers and substantially no etalon effect.

The present invention provides a method (and structure) in which a buried barrier is combined with a photodetector to block or eliminate the slow carriers. The buried barrier layer does not form an etalon, and may serve as a diffusive mirror.

It is noted that, for the sake of simplicity, the structure (and method) discussed herein is for the specific case of a silicon lateral trench detector (LTD). Although Si LTDs may be of special interest for certain applications, as would be clearly recognized by one of ordinary skill in the art after taking the present application as a whole, the structure (and method) is general and applicable to other photodiode structures such as PIN, MSM formed with other materials such as Ge, SiGe, InP, InGaAs, and GaAs, etc.

In the present invention, a plurality (e.g., four) of embodiments for the barrier layer are discussed. The fabrication methods combined with a device structure for each embodiment are also described.

In a first embodiment of the present invention, a photodiode such as a Si LTD, includes alternating lateral n+ and p+ fingers, and a lightly doped p-type absorption region built over (e.g., preferably on top of) a n-type substrate, thereby forming a p-n junction for blocking slow carriers. A different variant of the same structure includes a lightly doped n-type absorption region on top of an p-type substrate, again forming a p-n junction for blocking slow carriers.

In a second embodiment of the present invention, a photodiode such as a Si LTD, includes alternating lateral n+ and p+ fingers, and a lightly doped absorption region is built into (e.g., embedded in) a substrate. A barrier layer is inserted under the photodiode by counter-doping the substrate (e.g., if a p-type substrate is used, then a barrier is formed by n-type doping), thereby forming a p-n-p (e.g., assuming a p-type substrate) film stack for blocking slow carriers.

In a third embodiment of the present invention, a photodiode such as a Si LTD, includes alternating lateral n+ and p+ fingers built into lightly doped n-type or p-type absorption layer, is formed over a buried "bubble" layer that is embedded in the substrate. The bubble layer is for blocking and eliminating the slow carriers that are generated relatively deep in the substrate.

In a fourth embodiment of the present invention, a buried barrier layer such as a p-n junction or a bubble layer is locally formed under a photodiode. The buried layer is formed preferably only in selected areas of a wafer, and would typically cover at least the device area.

With the above and other aspects, features, and elements of the present invention, a high speed photodiode can be provided that essentially has very few (or preferably no) slow carriers and substantially no etalon effect.

Thus, in contrast to forming a heavily doped layer as a barrier for the slow carriers, the present invention offers several solutions for blocking or eliminating the slow carriers. As briefly mentioned above and as described in further detail below, these solutions are the p-n (or p-n-p) junction barrier and the bubble layer barrier. These structures are completely different from the heavily doped layer described above in the conventional techniques.

Indeed, with regard to the P-N junction embodiment, the mechanism by which the present invention obtains the blocking of the carriers with a P-N junction is completely different from a heavily doped layer for reducing the carriers' lifetime.

More specifically, in the first and second embodiments, the invention relies on the formation of a potential barrier to block the carriers. Since a different mechanism for blocking the carriers is exploited (e.g., a lightly doped P-N junction), problems are circumvented such as dopant diffusion that are typical with the heavily doped layers, and mutual-capacitance due to the doped film acting as a ground plane.

Regarding the "bubble" layer embodiment, this novel structure is not in any way discussed or hinted at by the conventional techniques.

More specifically, the bubble layer is physically different in structure and shape than any of the conventional structures. Additionally, the bubble layer combines in one layer two mechanisms for overcoming slow carriers (i.e., namely the elimination by recombination and a blocking effect).

Further, the bubble layer can be tuned to form a diffusive mirror due to the bubble nature of being random. The conventional techniques are completely silent as to the benefits of a diffusive reflection, and clearly would suffer from the etalon problem (due to the specular reflection).

BRIEF DESCRIPTION OF THE DRAWINGS

The invention is described in more details thereinafter relative to non-limitative embodiments and with reference to the attached drawings, in which:

FIG. 12–14 illustrate simulation results for a Si LTD with a buried p-n junction in which:

FIG. 12 illustrates simulated frequency response of Si LTDs with and without a buried junction;

FIG. 13 illustrates simulated transit-time-limited bandwidth and total bandwidth at −5.0V as a function of the spacing H between the buried p-n junction and the bottom of the fingers;

FIG. 14 illustrates simulated 2D contour plots of the net carrier concentration at −5.0V for H=1.5 µm (left-side view, showing punch-through) and H=3.5 µm (right-side view, showing no punch-through).

FIG. 16(a)–17 illustrate the simulation results of Si LTDs with a buried bubble layer in which:

FIGS. 16(a) to 16(c) illustrate the simulated frequency response for different properties of the bubble layer; and FIG. 17 illustrates the simulated dark current of Si LTDs with a buried bubble layer.

DETAILED DESCRIPTION OF PREFERRED EMBODIMENTS OF THE INVENTION

Figure 1:
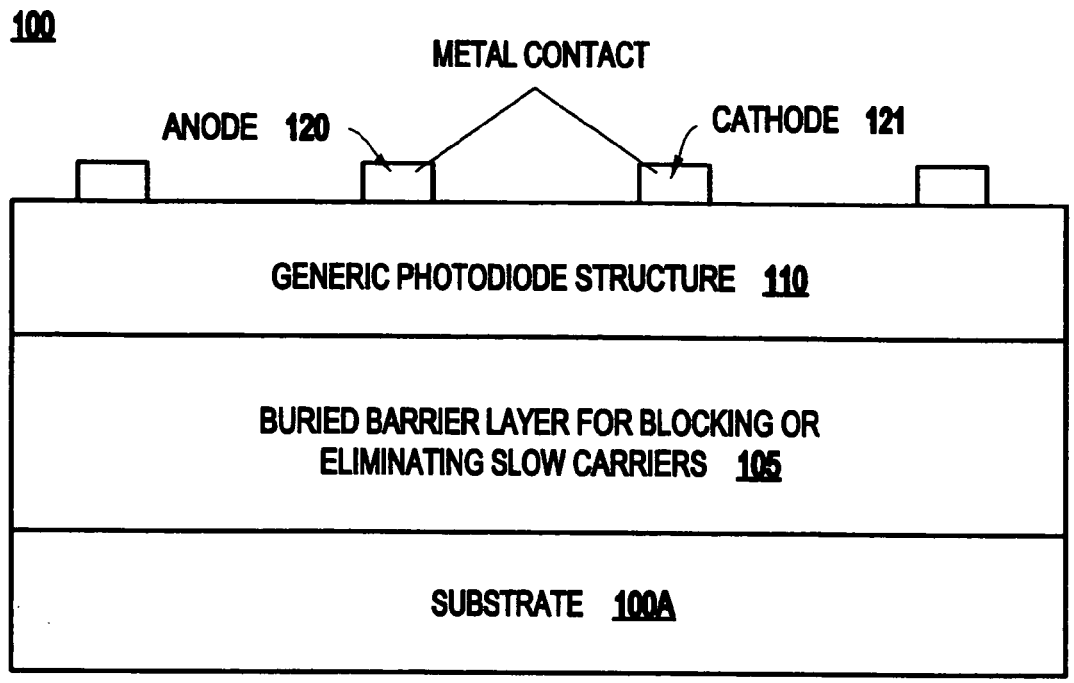
FIG. 1 illustrates a cross-sectional schematic of a generic photodiode 100 with a buried barrier layer 105 in a substrate 100A.

Referring now to the drawings, and more particularly to FIGS. 1–18, there are shown preferred embodiments of the method and structures according to the present invention.

FIG. 1 shows a structure 100 including a substrate 100A, such as a silicon substrate, over which a barrier layer 105 is formed. Preferably, the barrier layer 105 is formed directly on the substrate 100A.

The barrier layer 105 can be realized over (or on) the substrate 100A, for example, by a deposition or in the substrate 100 by ion implantation. Over the barrier layer, a generic photodiode device 110 such as a PIN, MSM or a LTD is fabricated. Contacts 120 and 121 to the device are also illustrated.

When the photodiode 110 is illuminated, a portion of the light is absorbed below the photodiode 10 (e.g., in the substrate 100A) where the electric field is relatively weak. In the absence of a barrier layer 105, these photo-carriers will slowly drift to the photodiode region 110, where they become part of the photocurrent. To block and/or eliminate the slow carriers, the invention introduces the barrier layer 105. The barrier layer prevents the slowly drifting carriers from reaching the photodiode region 110, so only the relatively fast carriers generated near the top surface (or between the trenches of an LTD structure) are collected at the contacts 120, 121.

Figure 2:
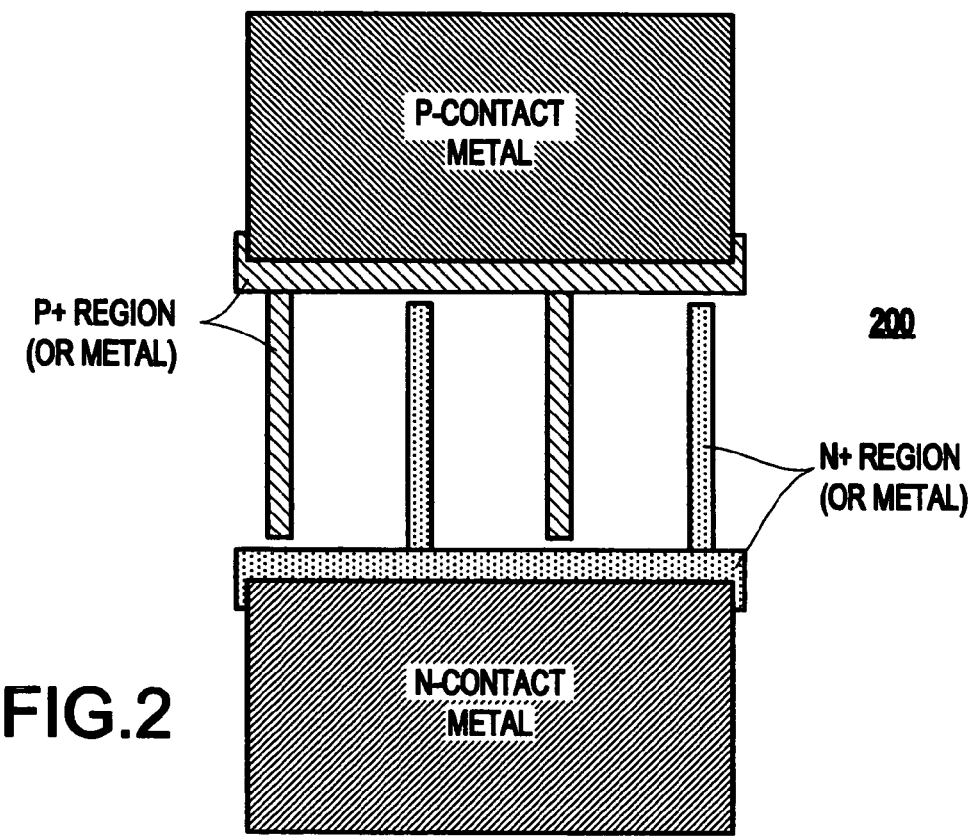
FIG. 2 illustrates a top view schematic of a lateral photodiode 200 with a buried barrier layer.

FIG. 2 illustrates a top view schematic of a lateral photodiode 200 with a buried barrier layer.

The present invention provides two types of barrier structures, namely the buried p-n junction barrier and the buried bubble layer. Hereinbelow are discussed various methods for forming the barriers and how they can be effectively combined with the photodiode structure.

A. A Buried P-N Junction Barrier

Figure 3:
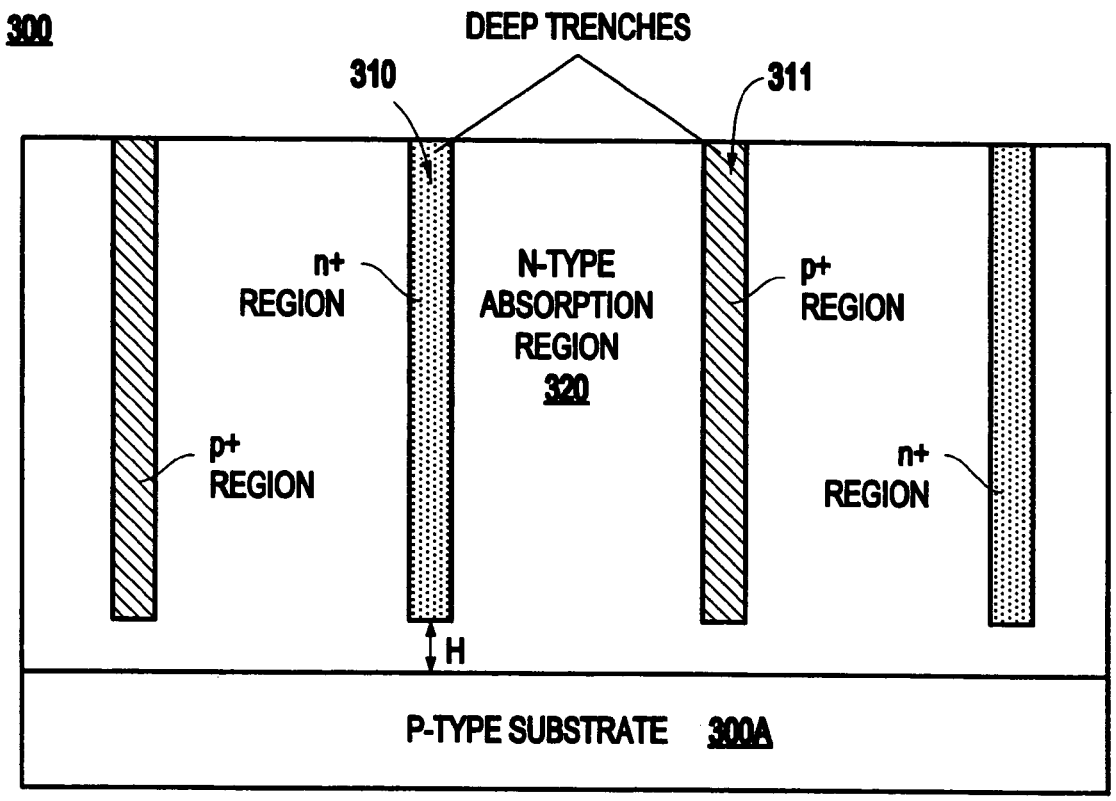
FIG. 3 illustrates a cross-sectional schematic of a LTD photodiode 300 with a buried single p-n junction.

FIG. 3 illustrates a structure 300 including a p-type substrate 300A having a photodiode structure with an n-type absorption region 320 and lateral n+ 310 and p+ 311 deep trenches.

Figure 4:
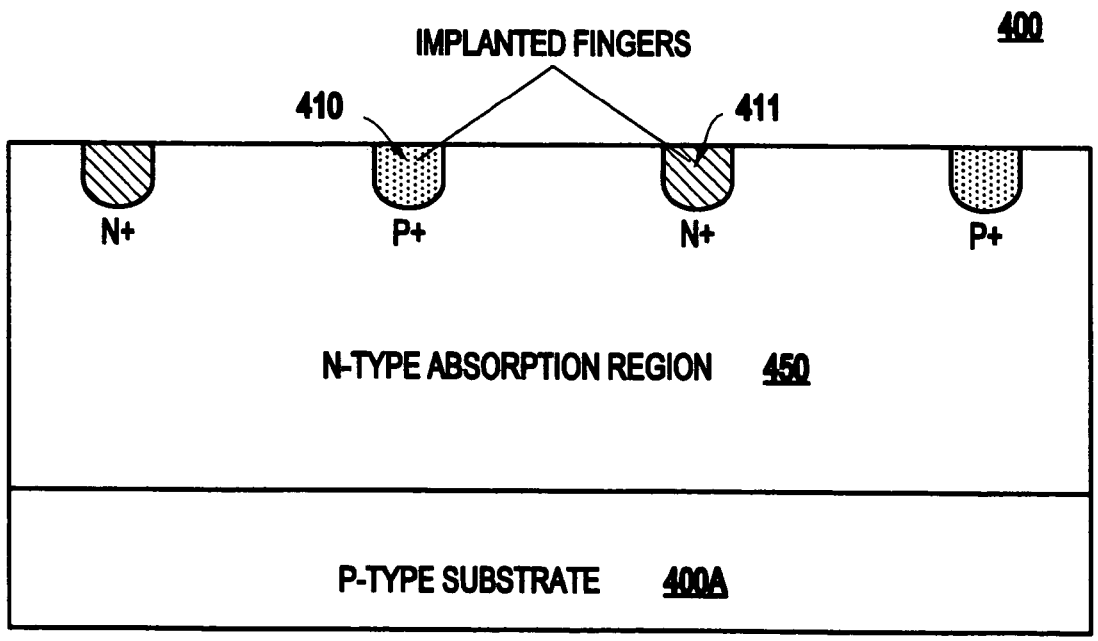
FIG. 4 illustrates a cross-sectional schematic of a lateral PIN photodiode 400 with a buried single p-n junction.

FIG. 4 shows a similar structure 400 using diffused or implanted n+ 410 and p+ 411 fingers including a p-type substrate 400A having a photodiode structure with an n-type absorption region 450.

Figure 5:
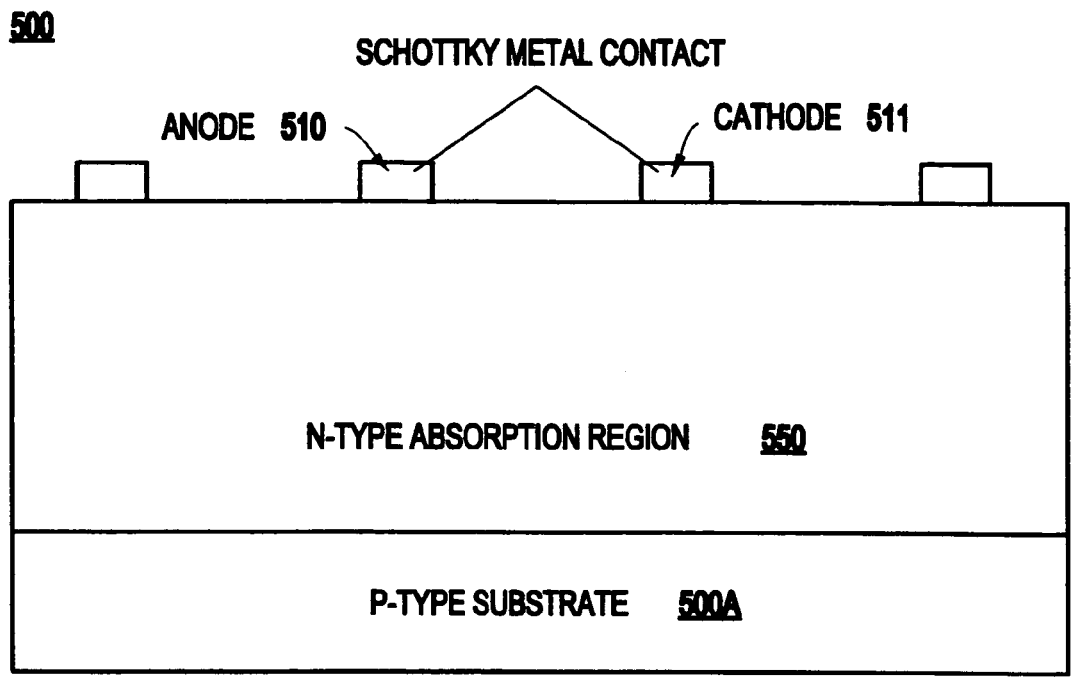
FIG. 5 illustrates a cross-sectional schematic of an MSM photodiode 500 with a buried single p-n junction.

FIG. 5 shows an implementation of a structure 500 using a metal-semiconductor-metal (MSM) photodetector, including a p-type substrate 500A having a photodiode structure with an n-type absorption region 550 and Schottky metal contacts including anode 510 and cathode 511.

A purpose of the buried PN junction barrier is to form a vertical electric field that blocks electrons and holes created in the substrate (e.g., in substrate 300A shown in FIG. 3) from drifting to the absorption region 320.

Figure 12:
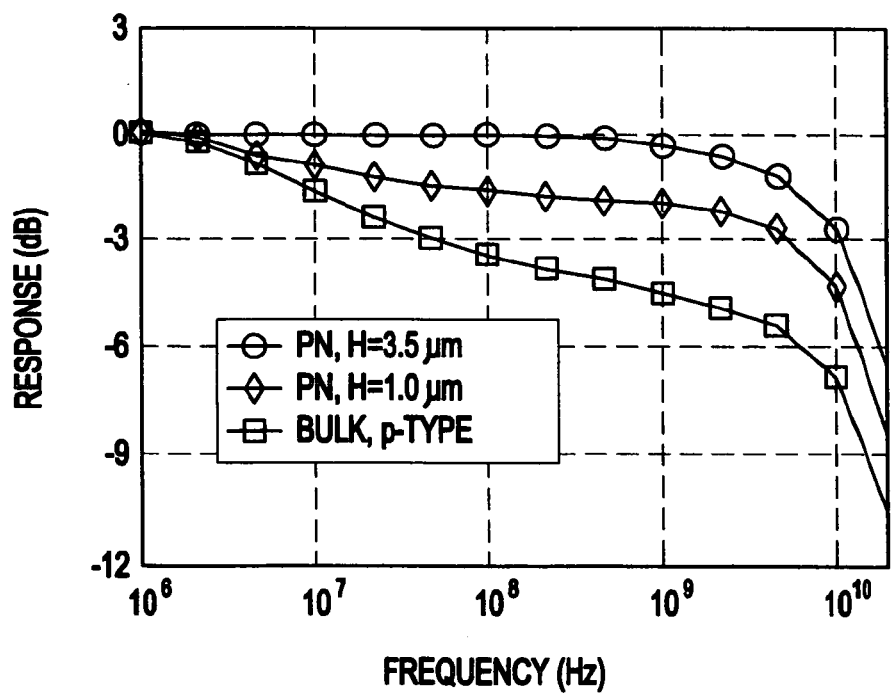

FIG. 12 shows the bandwidth improvement of a buried junction LTD compared to an LTD with a bulk p-type substrate. Further, the electric field created by the buried junction can actually speed up the carriers generated above the junction, thereby enhancing the bandwidth compared to an SOI structure.

Figure 13:
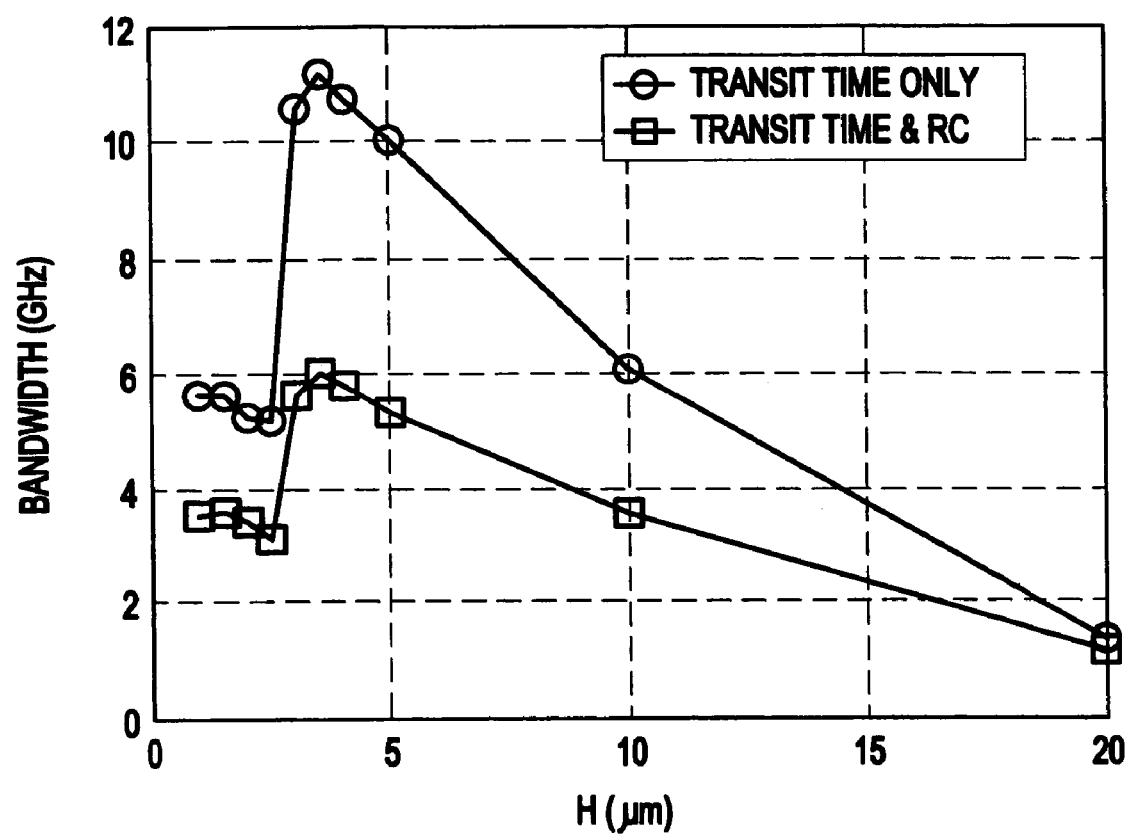

That is, FIG. 13 shows the transit time limited bandwidth and total bandwidth at −5V as a function of H for Si LTDs with a single buried p-n junction. H is the spacing between the buried junction and the bottom of the deep trench fingers.

Since this structure does not form a resonant cavity (etalon) as in an SOI structure, the quantum efficiency is not a strong function of the optical wavelength. Simulations and measurements indicate that these benefits are achieved even if there is no contact to the substrate (i.e., floating potential).

Moreover, the doping of the substrate 300A does not adversely affect the performance. Therefore, lightly doped substrates can be used, which eliminate contamination/autodoping concerns if using epitaxy to form the buried junction.

Figure 14:
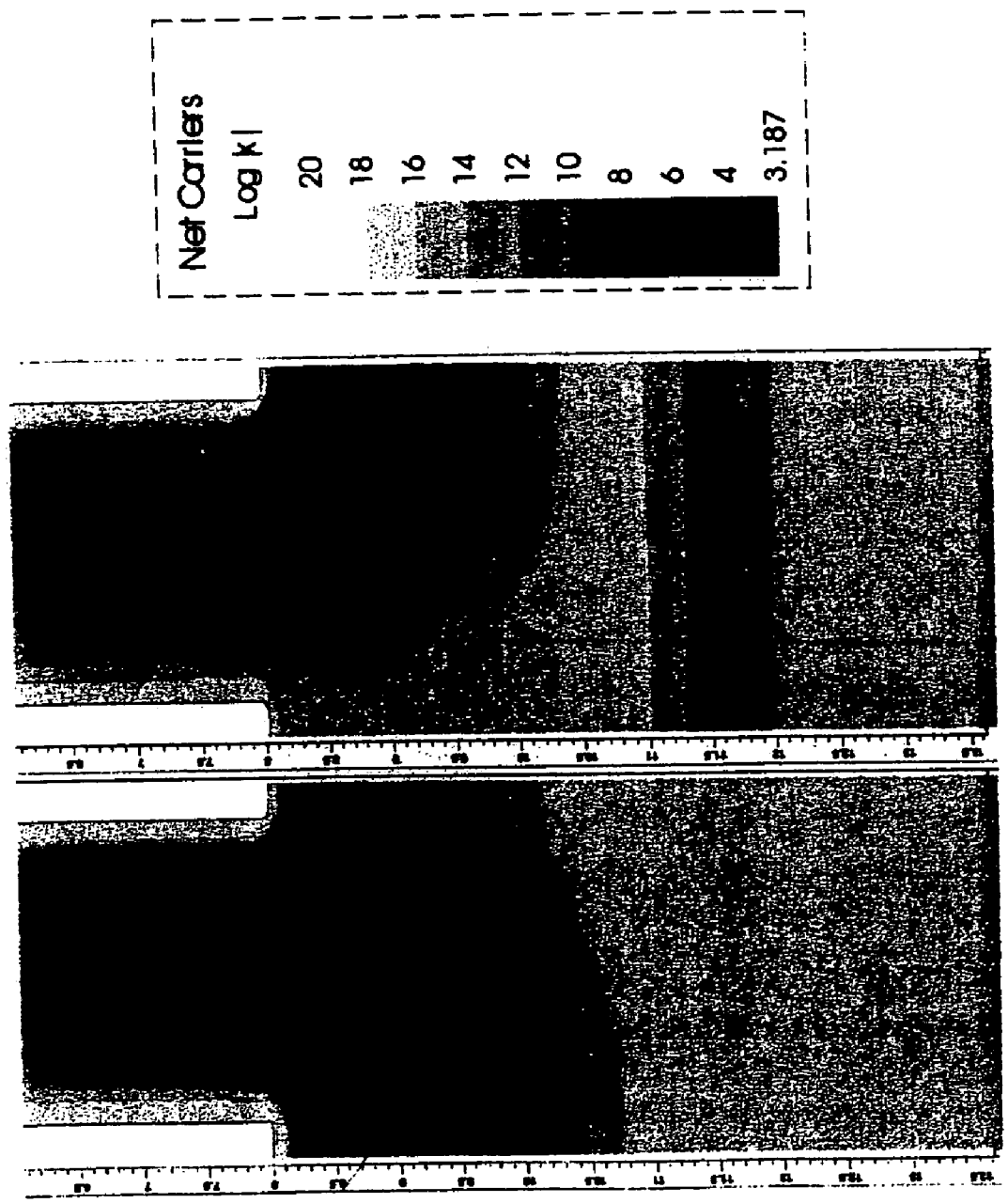

The buried p-n junction preferably is placed beneath the bottom of the n+ and p+ fingers or trenches, such that there is no punch-through between the depletion region of the buried p-n junction and the depletion region of the n+ and p+ fingers 310, 311. This ensures an optimum electric field barrier, and does not introduce additional dark current due to the buried junction. This effect is illustrated in FIG. 14, which shows that the bandwidth peaks at an optimum value of H, the distance between the bottom of the trench and the buried junction. Simulations are shown in FIG. 14 of the depletion region for two different values of H.

That is, FIG. 14 shows 2D contours plots of the net carrier concentration at −5V for H=1.5 μm (left-side view, showing punch-through) and H=3.5 μm (right-side view, showing no punch-through) for Si LTDs with a single buried p-n junction.

The buried p-n junction can be formed by ion implantation or epitaxial growth or wafer bonding, all of which are readily used in CMOS manufacturing processes. For LTDs with deep fingers (>8 μm), epitaxy is the preferred method of forming the buried p-n junction.

Figure 6:
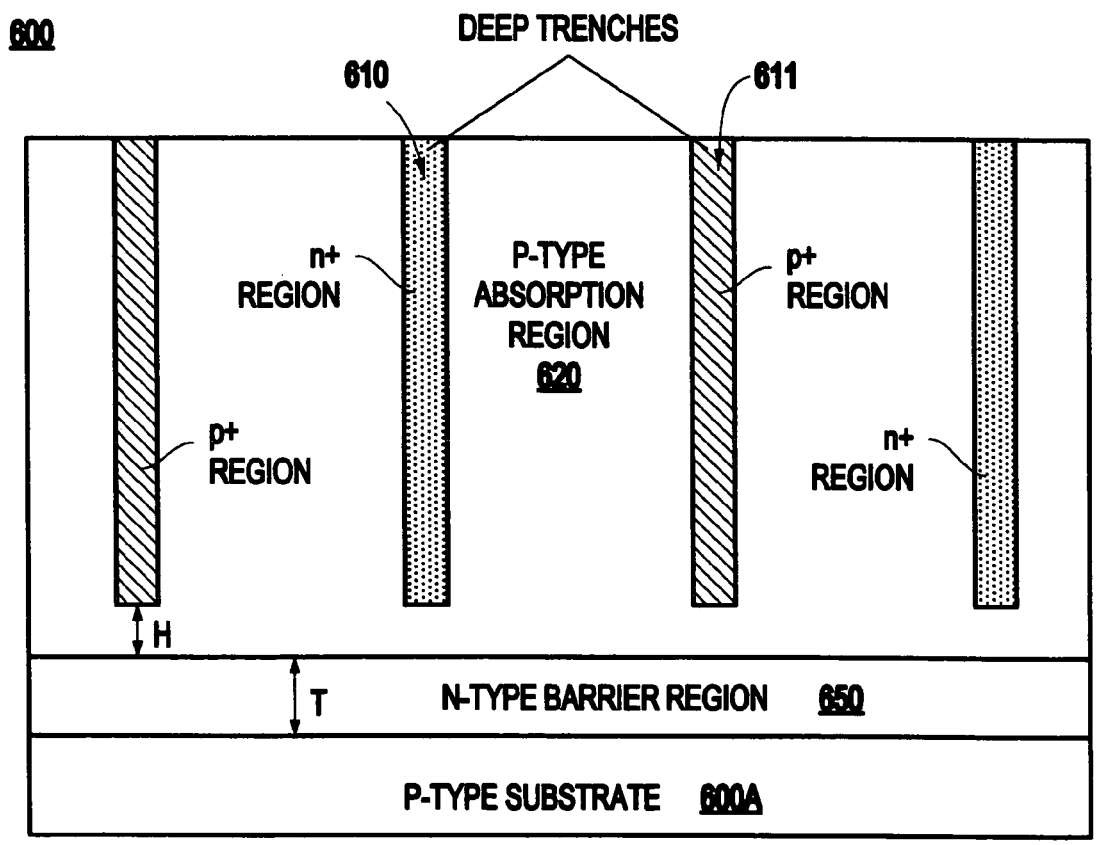
FIG. 6 illustrates a cross-sectional schematic of a LTD photodiode 600 with a buried dual p-n junction.

FIG. 6 illustrates a structure 600 including a p-type substrate 600A having a photodiode structure with an n-type barrier region 650 and a p-type absorption region 620 with lateral n+ (610) and p+ (611) deep trenches.

Figure 7:
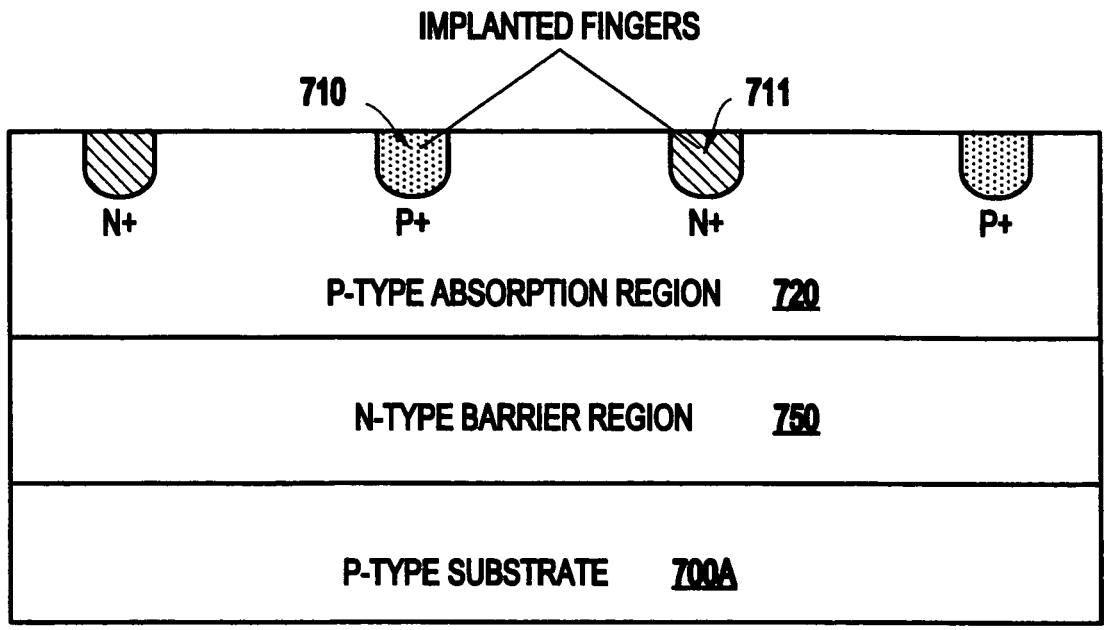
FIG. 7 illustrates a cross-sectional schematic of a PIN photodiode 700 with a buried dual p-n junction.
Figure 8:
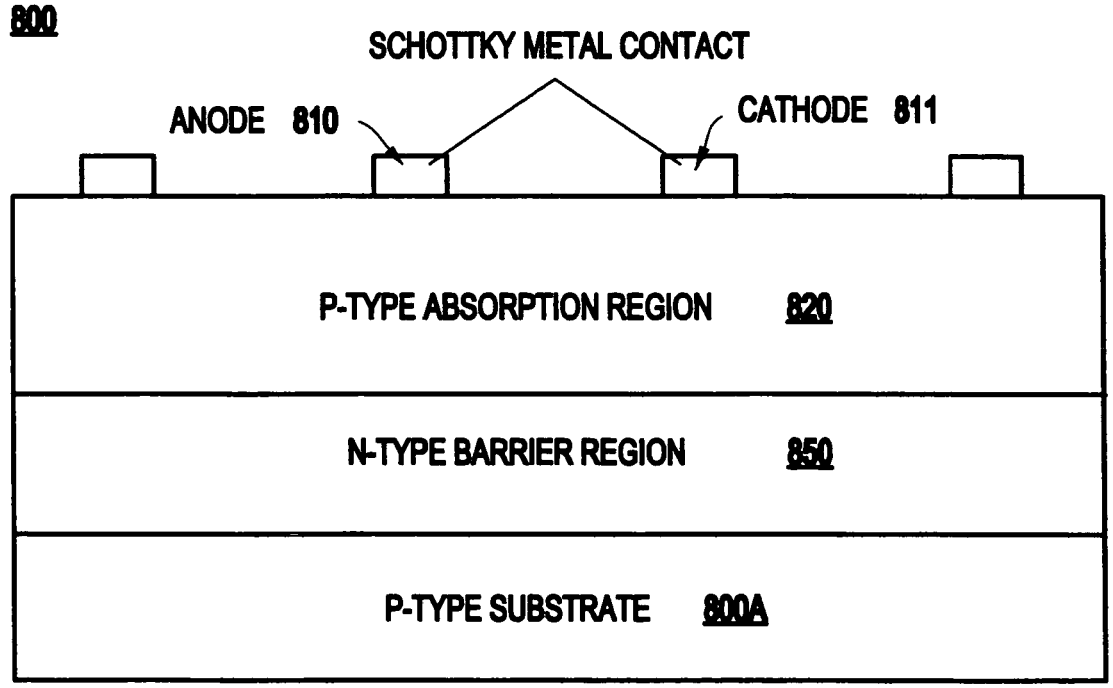
FIG. 8 illustrates a cross-sectional schematic of an MSM photodiode 800 with a buried dual p-n junction.

FIGS. 7 and 8 illustrate similar barrier regions incorporated into lateral surface PIN photodiode and a metal-semiconductor-metal photodetector, respectively.

Specifically, FIG. 7 illustrates a structure 700 including a p-type substrate 700A having a photodiode structure with an n-type barrier region 750 and a p-type absorption region 720 with lateral p+ (710) and n+ (711) diffused or implanted fingers.

FIG. 8 illustrates a structure 800 including a p-type substrate 800A having a photodiode structure with an n-type barrier region 850 and a p-type absorption region 820 and a Schottky metal contact including anode 810 and cathode 811.

In FIGS. 6–8, the dual p-n junction barrier serves the same purpose as the single p-n barrier illustrated in FIGS. 3–5. The dual barrier could potentially perform better than a single barrier in terms of blocking the slowly drifting carriers. The dual p-n junction could be formed by a single ion implantation, epitaxial growth or wafer bonding. For deep trench LTDs, epitaxy is preferred. For lateral surface PINs or metal-semiconductor metal detectors, ion implantation is preferred.

Thus, the first embodiment of the present invention provides a buried PN junction as a barrier layer by forming an implant or the like, and forms an electric barrier to the slow carriers which are absorbed below the PN junction. It is noted that this barrier layer does not necessarily instantly eliminate the slow carriers, but instead blocks the slow carriers from drifting upwardly to the anode and cathode contacts.

Additionally, in this embodiment, it is noted that the PN junction can be formed with relatively low doping, as opposed to high doping levels as used in the conventional techniques. This will overcome the issues of the processing of the conventional techniques discussed above, including diffusion, etc.

B. A Bubble Layer as a Barrier

Figure 9:
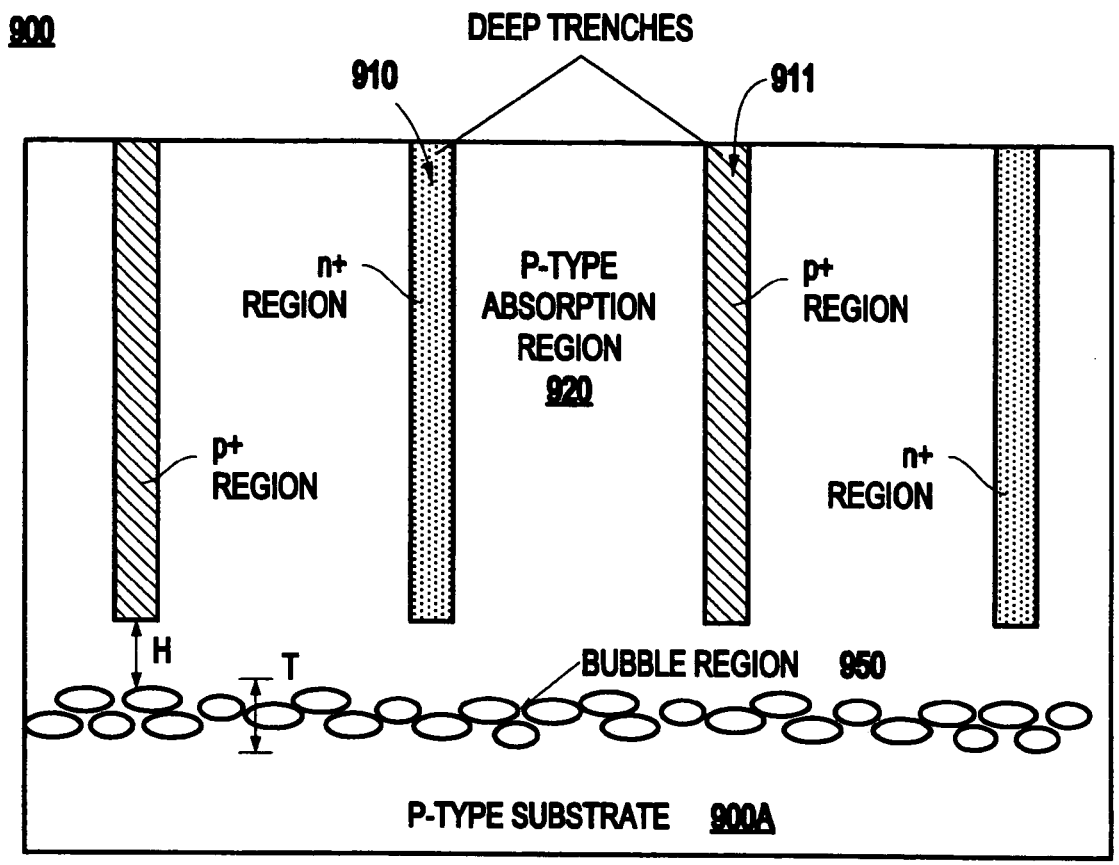
FIG. 9 illustrates a cross-sectional schematic of a LTD photodiode 900 with a buried bubble layer 950.
Figure 10:
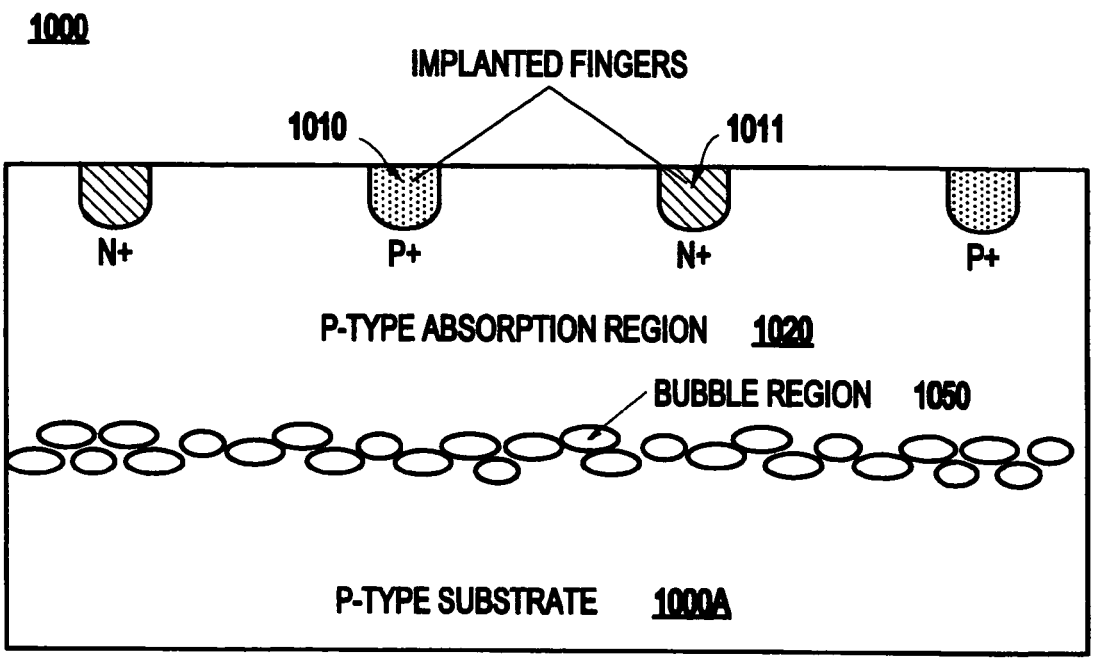
FIG. 10 illustrates the cross-sectional schematic of a PIN photodiode 1000 with a buried bubble layer 1050.
Figure 11:
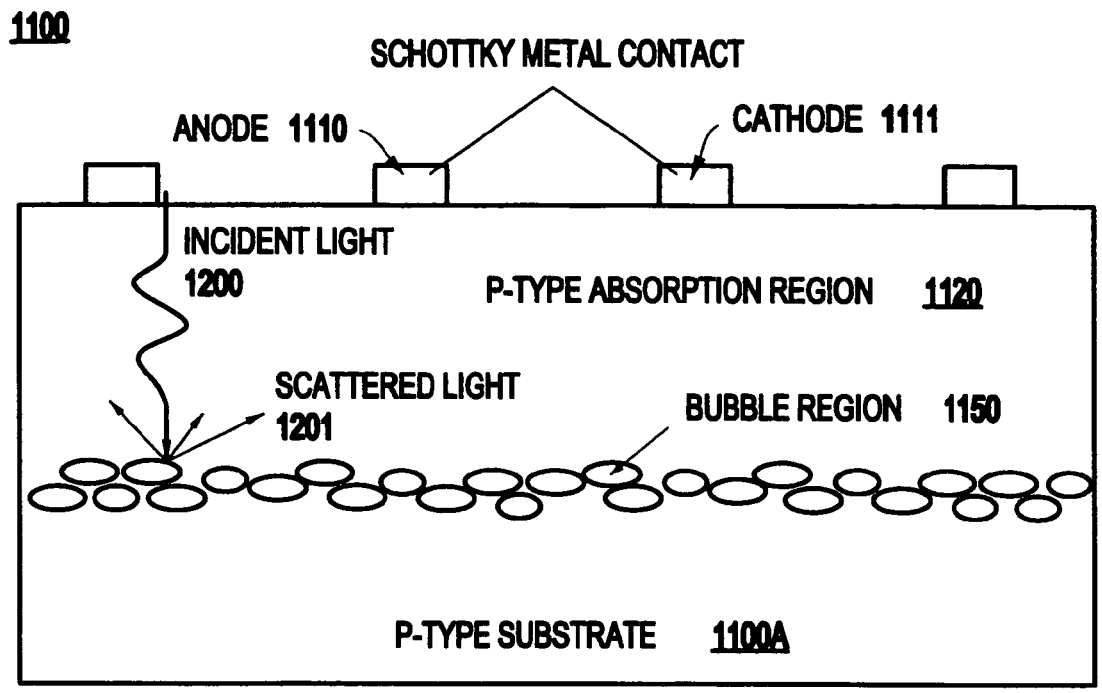
FIG. 11 illustrates a cross-sectional schematic of an MSM photodiode 1100 with a buried bubble layer 1150.

Turning now to a second embodiment of the present invention and FIGS. 9–11, a bubble layer is provided to block and eliminate the slow carriers. The annihilation of the carriers is achieved through very efficient recombination centers introduced by the bubbles and by defects formed between the bubbles.

FIG. 10 illustrates a structure including a substrate 1000A having a photodiode structure formed over a buried bubble layer 1050. The photodiode structure is a lateral PIN detector with an absorption region 1020, and alternating p+ (1010) and n+ (1011) fingers.

FIGS. 9 and 11 illustrate similar barrier regions incorporated into lateral trench detector and a metal-semiconductor-metal (MSM) photodetector, respectively.

Specifically, FIG. 9 illustrates a structure including a substrate 900A having a photodiode structure formed over a buried bubble layer 950. The photodiode structure is a lateral trench PIN detector with an absorption region 920, and alternating n+ (910) and p+ (911) deep trenches.

FIG. 11 illustrates a structure 1100 including a substrate 1100A having a photodiode structure formed over a buried bubble layer 1150. The photodiode structure is an MSM structure with a P-type absorption region 1120, and Schottky metal contacts including anode 1110 and cathode 1111. As shown, incident light 1200 is absorbed into the P-type absorption region to become incident on the bubble region 1150, and then scattered (e.g., scattered light 1201) by the bubbles in the bubble region 1150.

Returning to FIG. 10, the "buried bubble" region 1050 under the absorption region 1020 of the photodetector serves two purposes.

First, the bubble region 1050 functions as a recombination center for the slowly drifting deep carriers. As a result, only the fast carriers generated near the top surface (or between the trenches on an LTD structure) are collected at the contacts. The bandwidth will thus be similar to that of an SOI structure.

Secondly, a portion of the incident light will reflect off of the bubbles (e.g., scattered light 1201 in FIG. 11) and travel back through the active area of the detector, which will increase the effective absorption length, and thus improve the quantum efficiency. The scattering of the incident light 1200 by the bubble layer is illustrated in FIG. 11. Since the bubbles are small and irregular in shape and location, the bubble mirror will be diffusive and not cause the quantum efficiency to be a strong function of the wavelength, as in an SOI structure. Thus, the bubble layer functions as a diffusive mirror.

Preferably, the bubble layer is formed by first implanting helium into the substrate (e.g., 1000A in FIG. 10, etc.), and then annealing the substrate to form voids or bubbles. The implant energy controls the depth of the buried bubble layer. For example, an implant energy of 220 keV will position the bubble layer about one micron below the wafer's surface. The implant dose determines the density of the bubbles in the silicon film and their spread. Typical implanted helium doses are 2E16 to 6E16 $cm^{-2}$. The annealing method can be a furnace anneal or a rapid thermal annealing (RTA). The anneal temperature and duration can be used to control the bubble size and their size distribution. Typical anneal temperatures are 800C. to 1050C.

Examples of bubble layers formed by different implant conditions and/or anneal temperatures are shown in FIGS. 15A–15D.

Figure 15A:
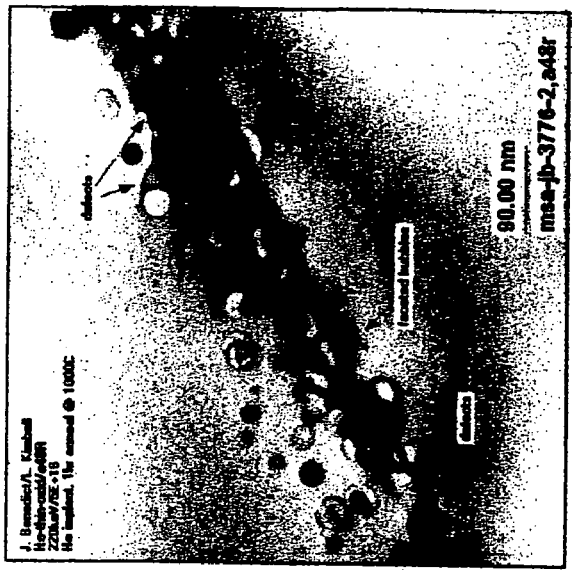
FIGS. 15A–15D respectively illustrate cross-sectional transmission electron micrographs (TEMs) of the bubble layers formed by different implant conditions and anneals.
Figure 15B:
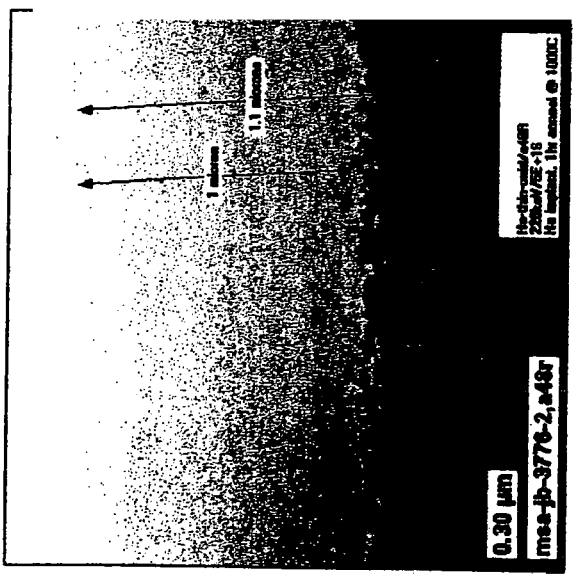
Figure 15C:
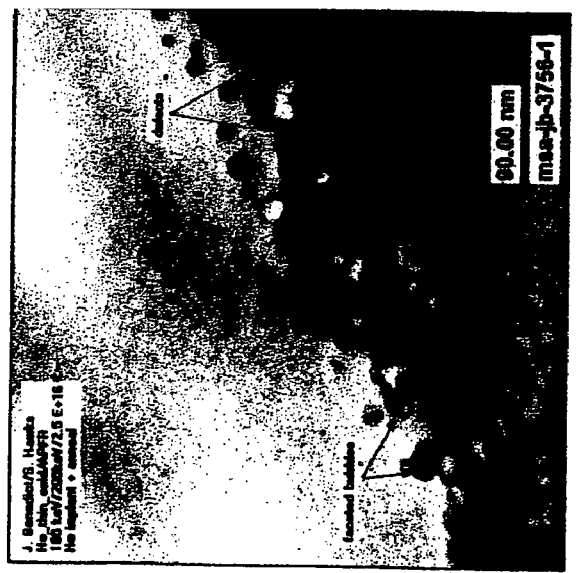
Figure 15D:
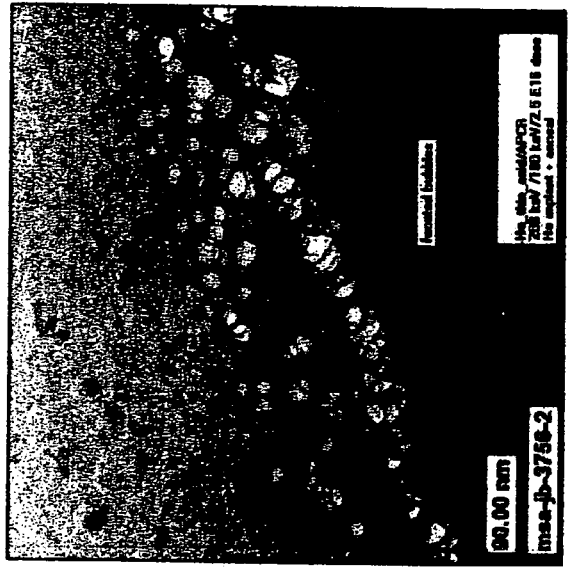
Figure 16B:
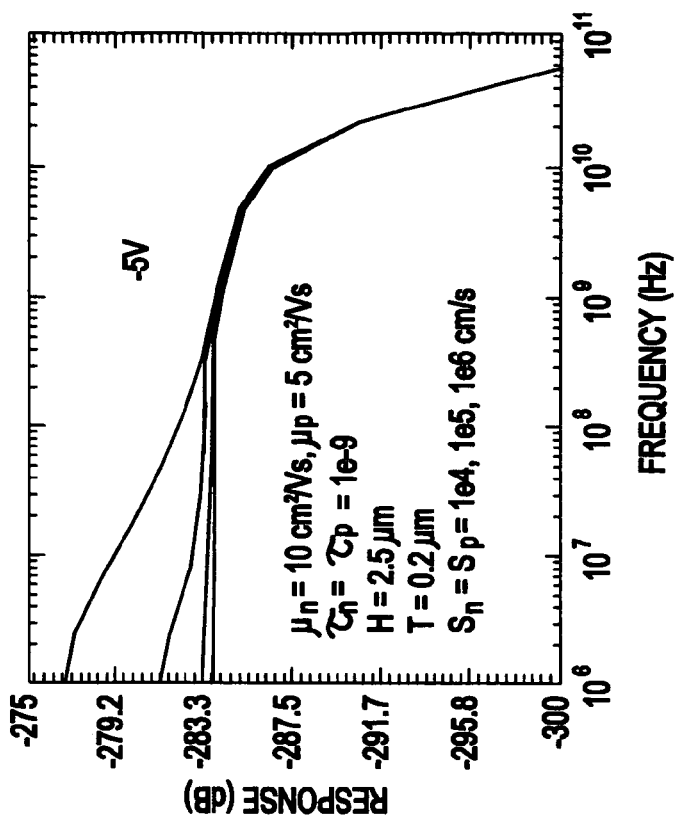
Figure 16A:
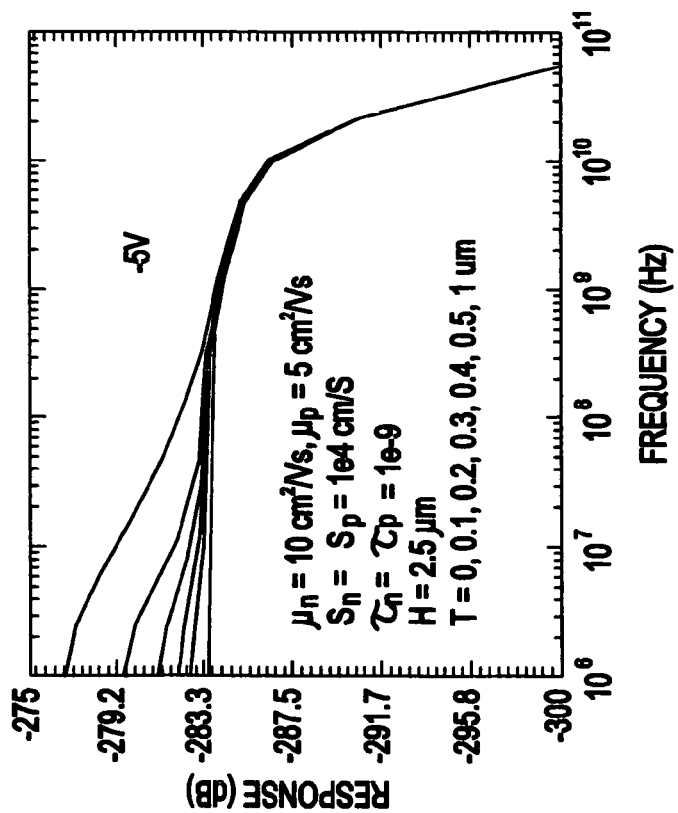
Figure 16C:
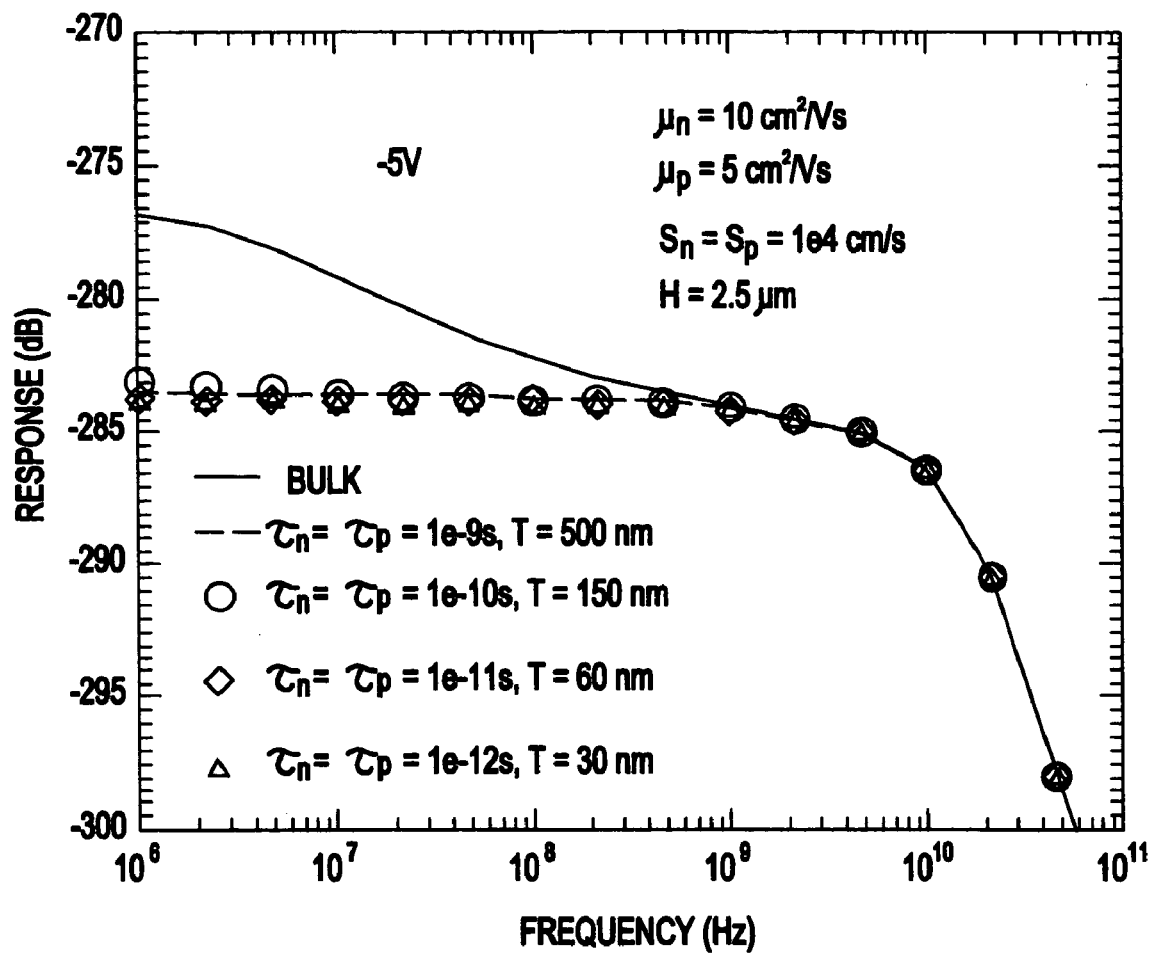
Figure 17:
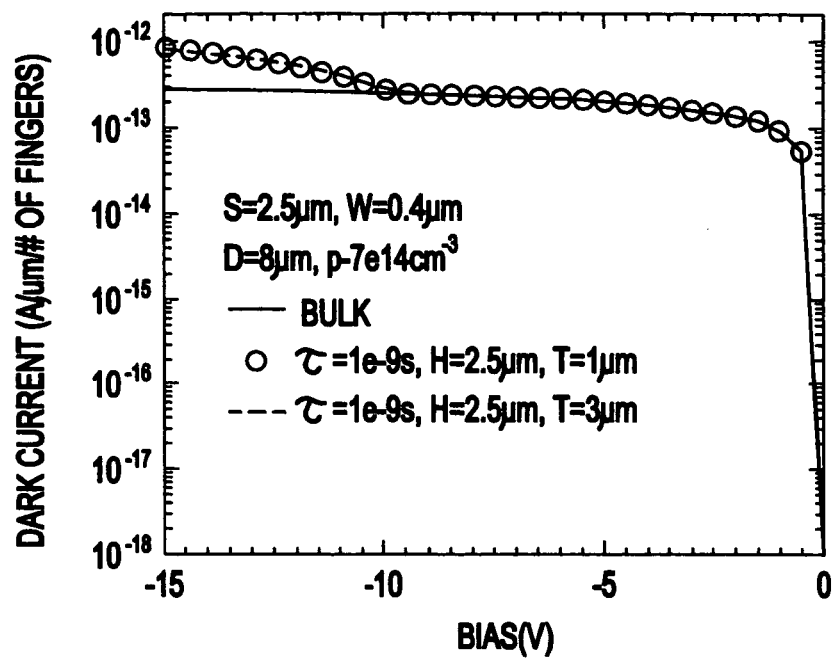

FIG. 15A shows the separation between the bubble layer and the photodetector, and FIGS. 15B–15D illustrate the faceted bubbles and the defects shown between bubbles. It is noted that a combinations of implants at different energies can also be used to control the properties of the bubble layer.

As an example, the bubble layer formed by an implant of 180 keV followed by a 200 keV implant is different than that formed when the implants order was reversed (i.e., a 200 keV implant followed by a 180 keV implant).

The bubbles themselves are not the only recombination centers. Indeed, defects (e.g., see FIGS. 15B–15D) that are created during the formation of the bubbles serve as highly efficient recombination centers for deep carriers. In addition, the recombination occurring at the surface of the bubbles further reduces the carrier lifetime.

Finally, the bubbles may also serve as scattering centers, which reduces the carrier mobility. The simulation results summarized in FIGS. 16(a)–16(c) and FIG. 17 show how the photodiode frequency response and dark current depends on the properties of the bubble layer. The simulations have shown that to effectively eliminate the slow carriers, the bubble layer should be located outside of the depletion region, and should be thicker than the diffusion length, $L_D$ ($L_D$=sqrt($D*\tau$), where D=$\mu*(KT/q)$ is the carrier diffusion, $\mu$ is mobility, T is temperature, q is the electron charge, and $\tau$ is life time in the bubble layer. The simulations have also shown that, as long as the bubble layer is located outside of the depletion region, there is no effect on the dark current.

The recombination mechanism in the bubble layer is completely different than that of a highly doped layer, as will be explained below.

The recombination of carriers in the bubble layer is achieved through energy levels that are introduced into the semiconductor bandgap by the bubbles and by defects formed between the bubbles. These energy levels (e.g., also known as "traps") are most efficient as recombination centers when located at midgap. Electron and holes are captured and emitted into and from the traps as they recombine. This process is also known as Shockley-Reed-Hall recombination.

An example that demonstrates how efficient this recombination mechanism is in silicon is the gold-in-silicon experiment. When gold is introduced into silicon, it introduces traps at about midgap. Depending on the gold concentration, the carrier lifetime can decrease from about 2E-7 s to 2E-10 s. (e.g., see S. M. Sze, Physics of Semiconductor Devices, 2nd Ed., p. 35–38, 1981). It is noted that the introduction of gold is typically avoided in fabrication of CMOS circuits and is considered a contamination of the wafer for the same reasons as discussed above. The bubble layer introduces traps and is compatible with CMOS fabrication, so the integration of a photodiode having a buried bubble layer with a CMOS circuit is possible.

In a highly doped layer, the recombination process is a band-to-band recombination. The transition of an electron from the conduction band to the valence band is made possible by emission of a photon (known as "radiative recombination"), or by the transfer of the energy to another free electron or hole, also known as "Auger recombination". In silicon, radiative recombination is negligible since silicon is an indirect bandgap semiconductor. The primary recombination mechanism left is therefore Auger recombination. Yet, even Auger recombination is not very efficient in silicon as it is with III-V semiconductor having a direct bandgap.

The buried bubble layer can be incorporated into a conventional bulk silicon wafer by implantation of helium (He) and annealing. Both processes are readily used CMOS manufacturing processes. As mentioned above, the bubble layer comprises irregular voids (e.g., both in size and location) which reflect the light in a diffusive fashion, and thus eliminate the etalon effect. If the bubbles are made small enough, as compared with the photon's wavelength (e.g., 20 nm in diameter), then no light is expected to be reflected from the bubble layer.

Additionally, it is noted that neither the bubble layer nor the PN junction need extend over the entire wafer, and thus a blanket implant need not be performed to produce the barrier over the entire wafer. Instead, the bubble layer (or PN junction) can be confined to specific regions (e.g., made locally to the photodetector) of the wafer by a masked implant, and thus there will be no effect on a neighboring integrated circuit (IC). This is a key advantage over the SOI structures in terms of integration and versatility, since the IC need not be taken into consideration when forming a photodiode, etc. Hence, again, from an integration standpoint, the invention is much superior.

Figure 18:
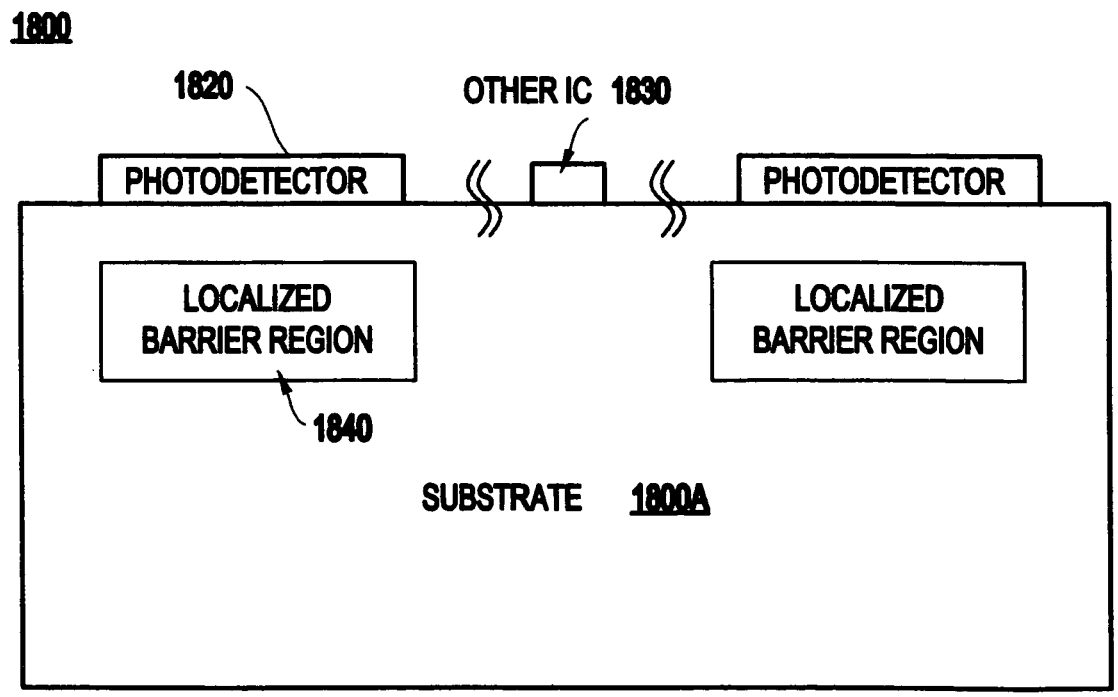
FIG. 18 illustrates a cross-sectional schematic of a wafer 1800 with a non-continuous barrier layer, forming islands which are localized underneath each photodetector 1820.

For example, FIG. 18 illustrates a structure (e.g., wafer or chip) 1800 which includes a substrate 1800A, with localized barrier region 1840 underneath the photodetector 1820. As such, the photodetectors can be selectively provided with other integrated circuits (ICs) 1830, thereby providing much versatility and flexibility in circuit configuration and fabrication.

Additionally, while it is noted that helium is preferred for implanting due to its stability, substances other than helium could be used for generating the bubble layer including a combination of He and Hydrogen. Hydrogen could conceivably used by itself under certain operating conditions. Hydrogen has been found to be useful for controlling the size of the bubbles.

While the invention has been described in terms of several preferred embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A device, comprising:
 a photodetector;
 a substrate formed under said photodetector; and
 a barrier layer formed over said substrate, wherein said barrier layer comprises a bubble layer, wherein said photodetector comprises a lateral trench detector.

2. The device of claim 1, wherein said photodetector is formed on said substrate.

3. The device of claim 1, wherein said photodetector is formed in said substrate.

4. The device of claim 1, wherein said barrier layer has a thickness within a range of about 0.05 µm to about 5 µm.

5. The device of claim 1, wherein said bubble layer comprises a recombination center for photo-generated carriers.

6. The device of claim 1, wherein said bubble layer comprises a buried light scatterer.

7. The device of claim 1, wherein said bubble layer contains voids ranging from about 5 nm to about 250 nm in size.

8. The device of claim 1, wherein said bubble layer is formed in a portion of said substrate.

9. The device of claim 1, wherein said barrier layer comprises a porous silicon film.

10. The device of claim 1, wherein said barrier layer is at least partially localized to said photodetector.

11. A wafer, comprising:
 a substrate; and
 at least one device formed over said substrate, said at least one device including a photodetector, and a barrier layer formed over said substrate and at least partially localized to said photodetector, wherein said baffler layer comprises a bubble layer, and
wherein said photodetector comprises a lateral trench detector.

12. The wafer according to claim 11, wherein the barrier layer is formed only in a portion below the photodetector.

13. A method of forming a device, comprising:
providing a photodetector;
forming a substrate under said photodetector; and
forming a barrier layer over said substrate, wherein said barrier layer comprises a bubble layer, and
wherein said photodetector comprises a lateral trench detector.

14. The method according to claim 13, wherein said forming a barrier layer comprises:
implanting helium into said substrate; and
annealing said substrate to form said barrier layer.

15. The method of claim 13, wherein said forming of said barrier layer comprises at least one of ion implantation, epitaxial growth, and wafer bonding.

16. The method of claim 13, wherein said forming of said barrier layer is at least partially localized to said photodetector.

17. A device, comprising:
a photodetector, said photodetector comprising a lateral trench detector;
a substrate formed under said photodetector; and
a barrier layer formed over said substrate, wherein said barrier layer comprises a bubble layer and wherein said bubble layer comprises one of a recombination center and a buried light scatterer, wherein said bubble layer includes voids being irregular in size and location, and have a diameter smaller than a photon's wavelength such that substantially no light is reflected from the bubble layer.

18. The device of claim 17, wherein the photodetectors includes contacts, and wherein said recombination center recombines said photo-generated carriers such that substantially only fast carriers generated near a top surface of the photodetector collect at said contacts of the photodetector.

19. The device of claim 17, wherein said buried light scatter functions as a diffusive mirror such that a portion of incident light reflects from bubbles of said bubble layer and causes said portion of said incident light to travel back through an active area of said photodetector.

* * * * *